(12) United States Patent
Erlich et al.

(10) Patent No.: US 8,214,780 B2
(45) Date of Patent: Jul. 3, 2012

(54) OPTIMIZATION OF VERIFICATION OF CHIP DESIGN

(75) Inventors: Tal Erlich, Haifa (IL); Daher Kaiss, Nahif Village (IL); Maayan Fishelson, Ramat Hasharon (IL)

(73) Assignee: Intel Corporation, Santa Clara, CA (US)

( * ) Notice: Subject to any disclaimer, the term of this patent is extended or adjusted under 35 U.S.C. 154(b) by 939 days.

(21) Appl. No.: 12/199,790

(22) Filed: Aug. 27, 2008

(65) Prior Publication Data

US 2010/0058259 A1    Mar. 4, 2010

(51) Int. Cl.
*G06F 17/50* (2006.01)

(52) U.S. Cl. ........ 716/104; 716/106; 716/107; 716/111; 716/132

(58) Field of Classification Search .................. 716/104, 716/106–107, 111, 132
See application file for complete search history.

(56) References Cited

U.S. PATENT DOCUMENTS

2006/0129953 A1*  6/2006  Jain .................................. 716/3
2008/0216032 A1*  9/2008  McElvain et al. ................. 716/5

OTHER PUBLICATIONS

Zaher Andraus, Karem Sakallah. "Automatic Abstraction and Verification of Verilog Models". Proceedings of the Design Automation Conference (DAC), ACM/IEEE, 218-223, Jun. 7-11, 2004.

* cited by examiner

*Primary Examiner* — Paul Dinh
(74) *Attorney, Agent, or Firm* — Schwabe, Williamson & Wyatt, P.C.

(57) ABSTRACT

Embodiments of methods and apparatus for optimization of verification of a chip design are disclosed. In various embodiments, a method for reducing a number of points to be verified during a verification process is disclosed, the method comprising selecting a first and a second verification point of a model of an integrated circuit design, determining whether the first and second verification points are isomorphic, and outputting the result of the determining to enable the first and second verification points being verified by verifying only a selected one of the first and second verification points in case the first and the second verification points are isomorphic. Additional variants and embodiments may also be disclosed and claimed.

7 Claims, 3 Drawing Sheets

OPTIMIZATION OF VERIFICATION OF CHIP DESIGN

TECHNICAL FIELD

Embodiments of the disclosure relate generally to fields of integrated circuits and electronic systems, and more particularly, to methods and apparatuses for optimization of verification of chip design.

BACKGROUND

During the design of a digital integrated circuit, a register transfer level (RTL) design is often used as a higher-level representation of the circuit. The RTL behavior of the circuit may be described with a hardware description language, such as Verilog. Once the RTL design is finalized, a lower, transistor-level representation may be derived from the RTL, often automatically. For the circuit to operate as intended, it is important to ensure that the lower, transistor-level model exhibits the desired behavior and functionality as specified via the higher-level RTL model.

Formal equivalence verification (FEV) is a process used to ensure correct implementation of integrated circuit designs by asserting that two representations of a circuit design exhibit equivalent behavior. FEV may be used to verify equivalence between the implementation (e.g., lower, transistor-level design) and specification (e.g., higher-level RTL). FEV may also be used when design changes are introduced, to ensure functional equivalence between the modified circuit model and the original circuit model. Formal property verification (FPV) process, on the other hand, is utilized to verify the functional correctness of properties specified on any given model of an integrated circuit design.

FEV compares the functional behavior of two models at a set of verification points, whereas FPV verifies the functional behavior of a model at a set of verification points. The number of verification points for FEV and/or FPV depends on the design size and complexity of a circuit, but it is usually very large. An integrated circuit design model may sometimes contain over 100,000 verification points. Checking such a large number of verification points may negatively impact the capacity and runtime of the verification process, and may also increase the user debug time.

BRIEF DESCRIPTION OF THE DRAWINGS

Various embodiments will be described referencing the accompanying drawings in which like references denote similar elements, and in which.

DETAILED DESCRIPTION OF ILLUSTRATIVE EMBODIMENTS

Figure 1A:
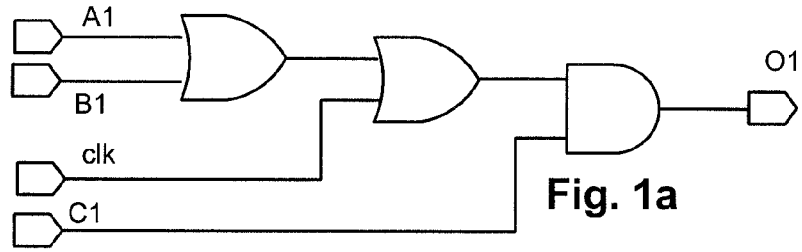
FIGS. 1a and 1b illustrate two different exemplary segments of a digital circuit included in a model of an integrated circuit design, in accordance with various embodiments.

Illustrative embodiments include, but are not limited to, methods and apparatus for optimization of formal verification of chip design.

Various aspects of the illustrative embodiments will be described using terms commonly employed by those skilled in the art to convey the substance of their work to others skilled in the art. However, it will be apparent to those skilled in the art that alternate embodiments may be practiced with only some of the described aspects. For purposes of explanation, specific numbers, materials, and configurations are set forth in order to provide a thorough understanding of the illustrative embodiments. However, it will be apparent to one skilled in the art that alternate embodiments may be practiced without the specific details. In other instances, well-known features are omitted or simplified in order not to obscure the illustrative embodiments.

Further, various operations will be described as multiple discrete operations, in turn, in a manner that is most helpful in understanding the illustrative embodiments; however, the order of description should not be construed as to imply that these operations are necessarily order dependent. In particular, these operations need not be performed in the order of presentation.

The phrase "in some embodiments" is used repeatedly. The phrase generally does not refer to the same embodiments; however, it may. The terms "comprising," "having," and "including" are synonymous, unless the context dictates otherwise. The phrase "A and/or B" means (A), (B), or (A and B). The phrase "A/B" means (A), (B), or (A and B), similar to the phrase "A and/or B." The phrase "at least one of A, B and C" means (A), (B), (C), (A and B), (A and C), (B and C) or (A, B and C). The phrase "(A) B" means (B) or (A and B), that is, A is optional.

Although specific embodiments have been illustrated and described herein, it will be appreciated by those of ordinary skill in the art that a wide variety of alternate and/or equivalent implementations may be substituted for the specific embodiments shown and described, without departing from the scope of the embodiments of the disclosure. This application is intended to cover any adaptations or variations of the embodiments discussed herein. Therefore, it is manifestly intended that the embodiments of the disclosure be limited only by the claims and the equivalents thereof.

As previously discussed, a verification process may need to compare and/or verify the functional behavior of a plurality of verification points of one or more models of digital circuit designs. In various embodiments, any two verification points P1 and P2 of a given model of a digital circuit design, with corresponding functions, F(P1) and F(P2), may be called isomorphic if and only if there is a one-to-one mapping from the variables of F(P1) to the variables of F(P2), such that if applied to F(P1), F(P2) is obtained. In various embodiments, two isomorphic points may yield same verification results when verified by a verification process because of the one-to-one mapping between the functions of the two verification points. Isomorphic verification points will be discussed in more details later.

Figure 1B:
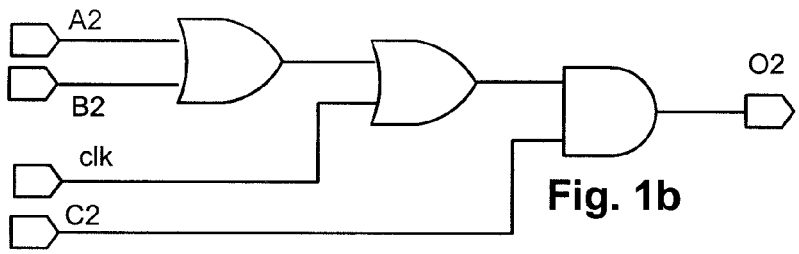

FIGS. 1a and 1b illustrate two different exemplary segments of a digital circuit included in a model of an integrated circuit design, in accordance with various embodiments. Note that FIGS. 1a and 1b illustrate two different exemplary segments of the same model. Also note that both circuit segments have similar structure, although they have different input signals and hence, different output signals. As will be apparent to those skilled in the art, the output O1 of FIG. 1a and the output O2 of FIG. 1b may represent two verification points of the model in which the circuit segments of FIGS. 1a and 1b belong to. While for ease of understanding, a simple circuit is illustrated in FIG. 1, from the description to follow, those skilled in the art would appreciate the present disclosure is not so limited to simple circuits, but may be applicable to a wide range of circuits of various complexity.

The function of the verification point corresponding to the output O1 (i.e., F(P1)) of FIG. 1a may be defined as $(((A1 \vee B1) \vee clk) \wedge C1)$, as will be apparent to those skilled in the art (where $\vee$ and $\wedge$ represents the OR and AND logical operations, respectively). Similarly, the function of the verification point corresponding to the output O2 (i.e., F(P2)) of FIG. 1b may be defined as $(((A2 \vee B2) \vee clk) \wedge C2)$. Thus, there may exist a one-to-one mapping from the variables of F(O1) to the variables of F(O2), the mapping being A1→A2, B1→B2, clk→clk, and C1→C2. Thus, the verification points O1 and O2 may be considered as isomorphic points, and yield the same verification results when verified by a verification process because of the one-to-one mapping between the functions of the two verification points. For example, if O1 passes a verification test, so will O2. On the other hand, if O1 fails a verification test, so will O2.

Figure 2:
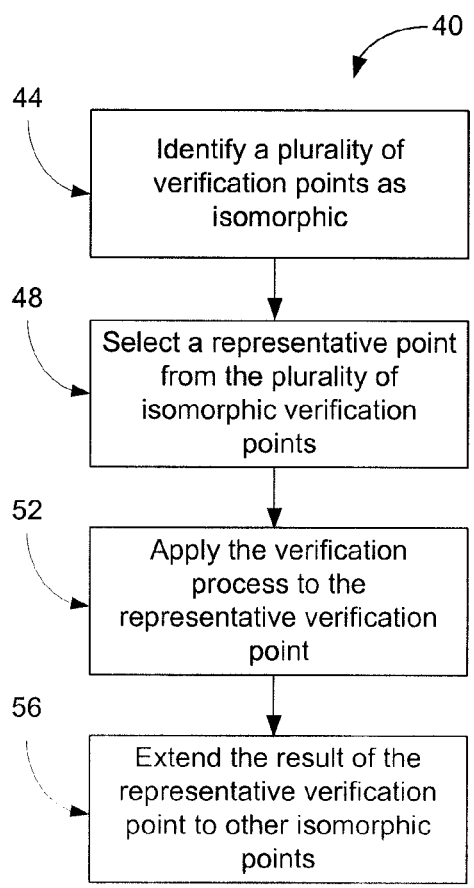
FIG. 2 illustrates an exemplary flow diagram of a method for applying a verification process to only one of a plurality of isomorphic verification points, in accordance with various embodiments.

FIG. 2 illustrates an exemplary flow diagram of a method 40 for applying a verification process to only one of a plurality of isomorphic verification points, in accordance with various embodiments. The verification process referred here may include any appropriate type of verification process, including the previously discussed FPV and FEV, and may be applied to a model of an integrated circuit design. The method 40 relies on reducing the number of verification points to be verified, based on isomorphism between verification points. In various embodiments, at 44, a plurality of verification points (e.g., a first verification point and a second verification point) in the model may be identified as isomorphic. For example, if a model includes the circuit segments of FIGS. 1a and 1b, the verification points O1 and O2 may be identified as isomorphic. Similarly, in various embodiments, a plurality of adjacent memory bits inside a memory may also be identified as isomorphic points. Identification of isomorphic verification points will be discussed in more details later.

As previously discussed, isomorphic verification points exhibit similar verification results. Hence, in various embodiments, it may not be necessary to apply the verification process to all the isomorphic verification points, and verification of only one of the identified plurality of isomorphic verification points may be sufficient. At 48, any one of the plurality of isomorphic verification points may be selected as a representative verification point. At 52, the verification process may be applied to the representative verification point. As the verification result of any one of the verification points is applicable to all other corresponding isomorphic verification points, the result of the verification process for the representative point may be extended to other isomorphic verification points, at 56.

In various embodiments, all operations described in relation to FIG. 2 may be carried by one or more computer processes. In various embodiments, each of the operations described in FIG. 2 may be carried by different computer processes. For example, in various embodiments, identification of isomorphic verification points at 44 may be carried out by a computer process, while some or all of the remaining operations may be carried out by a different computer process.

Figure 3:
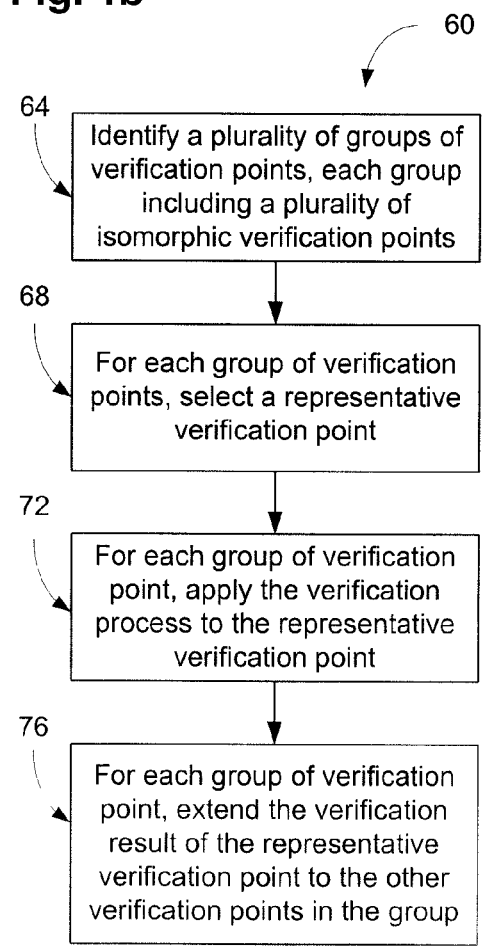
FIG. 3 illustrates another exemplary flow diagram of a method for reducing the number of verification points during a verification process, in accordance with various embodiments.

FIG. 3 illustrates another exemplary flow diagram of a method 60 for reducing a number of verification points during a verification process, in accordance with various embodiments. At 64, a plurality of groups of verification points is identified from all the verification points included in a model of an integrated circuit design to be verified, each group including a plurality of isomorphic verification points. For example, in various embodiments, an identified first group of verification points may include a first verification point and a second verification point, wherein the first verification point and the second verification point are isomorphic. Similarly, an identified second group of verification points may include a third, a fourth and a fifth verification point, wherein the third, fourth and fifth verification points are isomorphic. Identification of groups of isomorphic verification points will be discussed in more details later.

At 68, for each group of verification points, a representative verification point may be selected. For example, in various embodiments, the second verification point from the first group of verification points may be chosen as a representative verification point for the first group of verification points, whereas the fourth verification point from the second group of verification points may be chosen as a representative verification point for the second group of verification points.

At 72, for each group of verification points, a verification process may be applied to the representative verification point. For example, in various embodiments, the verification process may be applied to the second and the fourth verification points (which are the representative verification points of the first and second groups of verification points, respectively).

At 76, for each group of verification points, the verification result of the representative verification point may be extended to the other verification points in the group. For example, in various embodiments, the verification results of the second verification point (i.e., the representative point in the first group of verification points) may be extended to the first verification point (which also belongs to the first group of verification points). Similarly, the verification results of the fourth verification point (i.e., the representative point in the second group of verification points) may be extended to the third and fifth verification points (which also belong to the second group of verification points).

In various embodiments, all operations described in relation to FIG. 3 may be carried by one or more computer processes. In various embodiments, each of the operations described in FIG. 3 may be carried by different computer processes. For example, grouping of the verification points at 64 and/or selection of representative verification points at 68 may be carried out by one computer process, while verification of the representative verification point at 72 and/or extending the results at 76 may be carried out by a different computer process.

As will be apparent, the methods of FIGS. 2 and 3 may result in substantial reduction in the number of points to be verified during a verification process, because only one representative point from a plurality of isomorphic verification points needs to be verified during the verification process. The reduction in the number of verification points may result in substantially less verification process run time and may increase the performance of the verification program. Reduction in the number of verification points may also lead to an improvement in the debug time, since for each failing representative verification point, a user may need to debug only one verification point (possibly the representative point) from the corresponding group of isomorphic verification points.

In various embodiments, formal equivalence tools normally may not scale to full-chip verification. Rather, both models (e.g., a first model and a second model) to be verified (in FEV) may be decomposed into smaller slices and the verification may be performed separately on each slice. In various embodiments, this decomposition may be performed using mapping between signals. Namely, two signals that are assumed to be equivalent, one from the first model and one from the second model, may be mapped to each other. Each such mapped signal may be an output in one slice and an input in the adjacent slice. In the slice where the mapped signals serve as inputs, the assumption may be that they are equivalent to each other for the two models. This may be needed to be proved in the context where these mapped signals are outputs. Therefore, each mapped signal may be needed to be treated as an output, or a verification point, in the verification process. Thus, the verification points may comprise of all primary outputs of the respective model and all mapping points.

Figure 4A:
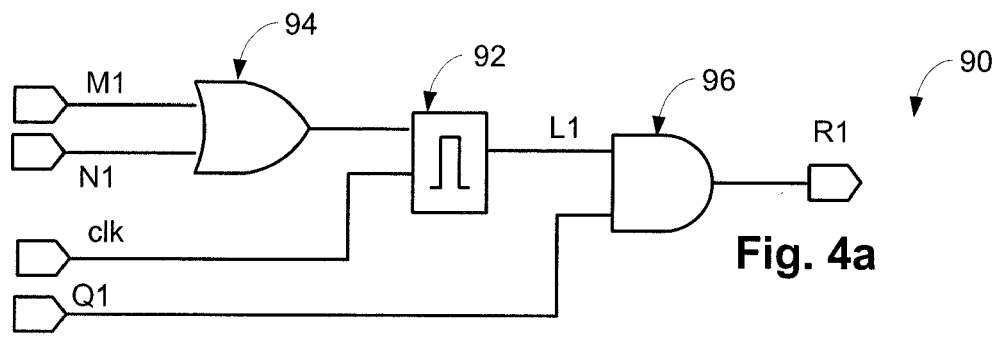
FIGS. 4a and 4b illustrate two different exemplary segments of a circuit included in a model, in accordance with various embodiments.
Figure 4B:
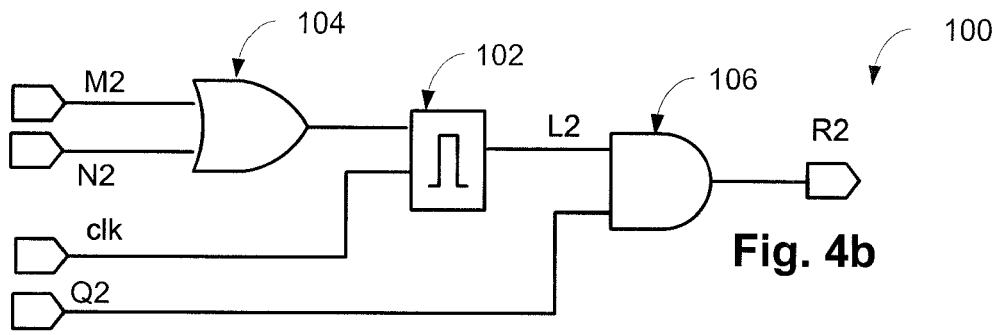

FIGS. 4a and 4b illustrate two different exemplary segments of a circuit included in a model of an integrated circuit design, in accordance with various embodiments. Note that FIGS. 4a and 4b illustrate two different exemplary segments of the same model. FIG. 4a illustrates a circuit segment 90 that includes a latch 92, which outputs a signal L1. In various embodiments, the circuit segment 90 may be a segment of a first model, and signals M1, N1, Q1, elk, L1 and R1 of FIG. 4a may be mapped to corresponding signals in a second model (not illustrated in the figure), assuming that the FEV process may verify equivalence between points of the first and the second models. In various embodiments, if the latch 92 is used as a mapping point, then the output of the latch (i.e., L1) may be a verification point (and output R1 may be another verification point). In various embodiments, the circuit segment of FIG. 4a may be divided into two verification slices. One slice may be bounded by inputs elk, M1 and N1 and output L1. The second slice may have Q1 and L1 as its input and R1 as its output. Similar analysis holds for the circuit of FIG. 4b as well.

Referring to FIG. 4a, the circuit segment 90 may include combinational elements (the OR gate 94 and AND gate 96), sequential elements (latch 92), inputs M1, N1, Q1 and elk, and output R1. In various embodiments, for simplicity, it is assumed that the latch 92 may transfer its input to its output when the clock signal clk is high, and may hold its value when the clock signal is low. In various embodiments, the current state value of a variable "v" may be denoted by v, and the next-state value by v'. Accordingly, the next state function (NSF) of the output R1 (i.e., NSF(R1)) may be (L1' $\wedge$ Q1'), whereas the NSF(L1) may be ((clk' $\wedge$ (M1' V N1'))V ($\neg$clk' $\wedge$ L1)) (wherein the symbol '$\neg$' may denote a logical negation operation, i.e., '$\neg$clk' may be a signal that is logical reverse of the clk signal, as is well known to those skilled in the art). As seen, next state functions may be conveniently represented by Boolean expressions. In Boolean expression representation, the nodes of a graph may represent binary operations, such as $\wedge$ (AND) and V (OR), and variables may appear as leaves with an annotation whether the variable is negated or not.

As will be readily apparent, similar analysis holds for FIG. 4b as well. As will also be readily apparent, the verification points L1 and L2 of FIGS. 4a and 4b are isomorphic, and the verification points R1 and R2 of FIGS. 4a and 4b are isomorphic, and will be discussed in more details later.

In various embodiments, finding isomorphic verification points may be based on canonizing the verification points' functions. For example, in various embodiments, the logic of each verification point (with its assumptions) may be decomposed by forming a set of slices, each slice containing at most one internal sequential element. The inputs of each slice may be either primary inputs of the design, or sequential elements. The logic of each slice may be converted to a Boolean expression graph where the inputs of the slice may be the leaf nodes of the graph. Computing a canonical representation of each Boolean expression may be performed by renaming the variables of the Boolean expression using a pre-defined naming scheme. Isomorphic Boolean expressions may have the same canonical representation. In order to allow quick comparison, a signature may be generated for each slice based on its canonical representation. The signature of each verification point may be computed by concatenating the signatures of the Boolean expressions of the slices that compose it, and the assumptions. The verification points may be split into groups which share the same signature, thereby creating groups of isomorphic verification points. The groups of isomorphic verification points may be then used for methods 40 and 60, described with respect to FIGS. 2 and 3, respectively, to reduce the number of verification points that need to be verified.

Figure 5:
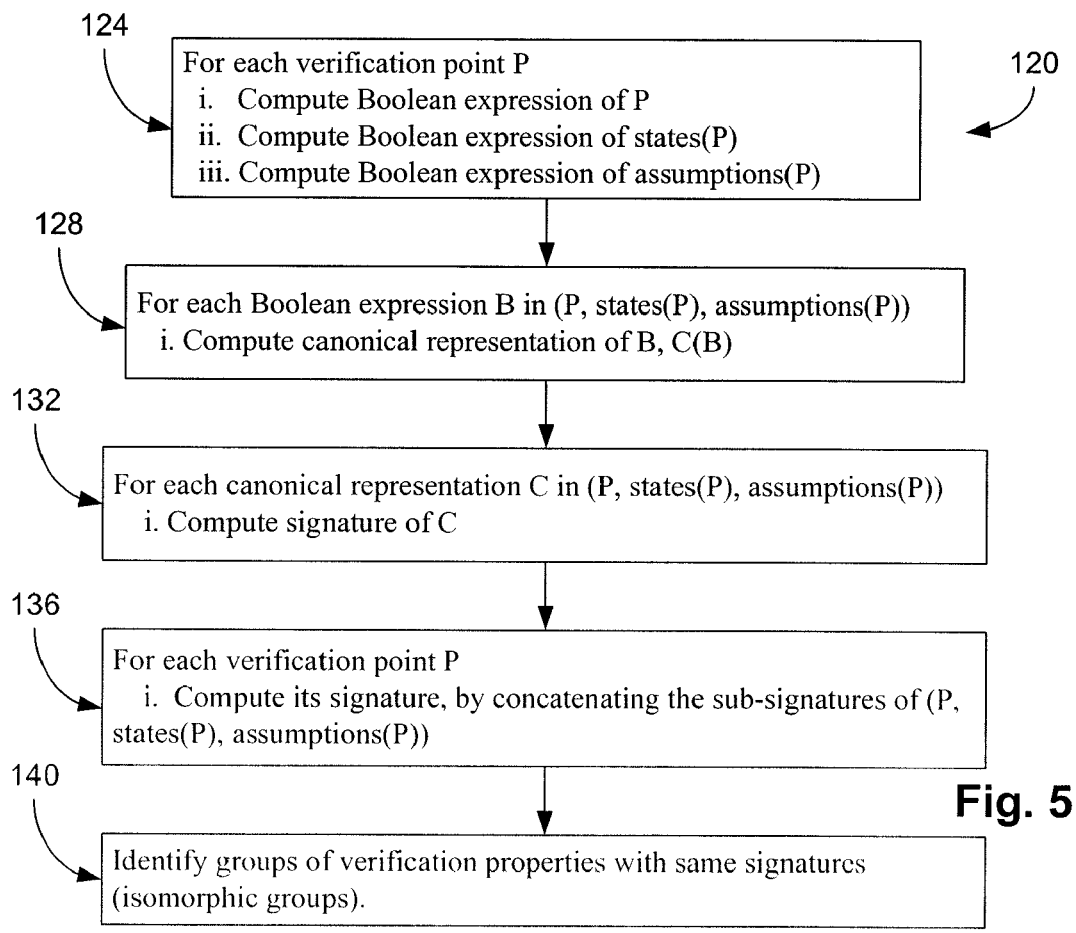
FIG. 5 illustrates an exemplary flow diagram of a method for grouping verification points based on isomorphism, in accordance with various embodiments.

FIG. 5 illustrates an exemplary flow diagram of a method 120 for grouping verification points based on isomorphism, in accordance with various embodiments. In various embodiments, the method 120 of FIG. 5 may be used to identify and group a plurality of verification points as isomorphic points.

Referring to FIG. 5, in various embodiments, at 124, for each verification point P, Boolean expressions of the verification point P, states of P and assumptions of P may be calculated. For example, the Boolean expression of the verification point R1 of FIG. 4a may be (L1 $\wedge$ V1) and the Boolean expression of the verification point L1 may be ((C1 $\wedge$ (V2 V V3)) V ($\neg$C1 $\wedge$ L1)) (wherein the variables of the Boolean expressions have been renamed using an appropriate pre-defined naming scheme, i.e., the inputs Q1, M1, N1 and clk may be replaced by generic variables V1, V2, V3 and C1, respectively). Assumptions of a verification point P may include various assumptions about the inputs of the slice corresponding to this point. As a verification point may correspond to sequential logic component (e.g., latches 92 and 102 of FIGS. 4a and 4b), the states of the verification point may also be relevant.

Computing the canonical representation of each Boolean expression may include renaming the variables of the Boolean expressions using a pre-defined naming scheme. In various embodiments, renaming the variables of a function may sometimes help in identification of isomorphic points. For example, assume a first function G1=((H1 AND J1) AND K1), and a second function G2=(H2 AND (J2 AND K2)), with H1, H2, J1, J2, K1, and K2 forming inputs to the respective functions. The variables may be renamed in a plurality of ways. In various embodiments, for example, the variables of the first function may be renamed as per the following mapping: H1→S1, J1→S2, and K1→S3, and the variables of the second function may be renamed as per the following mapping: H2→S1, J2→S2, and K2→S3. As a result, after the renaming of the variables, the modified first function may be expressed as G1'=((S1 AND S2) AND S3), and the modified second function may be expressed as G2'=(S1 AND (S2 AND S3)). As will be apparent to those skilled in the art, the Boolean expression graphs of the functions G1' and G2' may be similar, and the isomorphism between the functions may be readily identified by comparing their Boolean expression graphs. As another example, the similarity of the two circuit segments in FIGS. 4a and 4b may be readily identified by properly renaming the associated variables.

As previously discussed, renaming of variables may be performed in a plurality of ways, and in various embodiments, the renaming of the functions C1 and G2 may be done in a different manner as well. For example, in various embodiments, the variables of the first function G1 may be renamed as follows: H1→S1, J1→S2, and K1→S3, and the variables of the second function may be renamed as follows: J2→S1, H2→S2, and K2→S3. As a result, after renaming of the variables, the modified first function may be expressed as G1"=((S1 AND S2) AND S3), and the modified second function may be expressed as G2"=(S2 AND (S1 AND S3)). As will be apparent to those skilled in the art, the Boolean expression Graph of the functions G1" and G2" may be different, even though G1 and G2 may be functionally similar.

Thus, although renaming the variables may sometimes help to identify isomorphic functions, this may not always be the case. In various embodiments, obtaining the canonical representation of these apparently dissimilar (although functionally equivalent) Boolean expressions may help in identifying the similarity. Accordingly, in various embodiments, at 128, for each Boolean expression obtained at 124, a canonical representation of the Boolean expression may be computed in various embodiments, an exemplary canonical representation of a Boolean expression may be achieved utilizing Binary Decision Diagrams (BDDs). However, any other appropriate form of canonical representations may also be used. As is well known in the art, a BDD is a data structure that is used to represent a Boolean function and is canonical (i.e., unique) for a particular Boolean function. That is, under a given variable order, each Boolean function may have a unique BDD representation.

For example, two Boolean expressions, ((b1 ∧ b2) ∧ b3) and (b2 ∧ (b1 ∧ b3)), may be structurally different, but both Boolean expressions may represent the same function (i.e., isomorphic verification points). That is, these two Boolean expressions may have different Boolean expression graphs, as will be apparent to those skilled in the art. Nevertheless, their BDD-based canonical representation may be equivalent, under the assumption that they are translated into BDD using the same variable order, as will be readily appreciated by those skilled in the art. Put differently, even though these two are dissimilar Boolean expressions, they represent the same Boolean function, and hence, have the same BDD representation.

As previously discussed, computing the canonical representation of each Boolean expression may include renaming the variables of the Boolean expressions using a pre-defined naming scheme. For example, the canonical representation of NSF(R1) of FIG. 4a may be (L1 ∧ V1), and the canonical representation of NSF(L1) may be ((C1 ∧ (V2 ∨ V3)) ∨ (¬C1 ∧ L1)). The canonical representation of R1 may, thus, be composed of two functions (L1 ∧ V1) and ((C1 ∧ (V2 ∨ V3)) ∨ (¬C1 ∧ L1)). Note that the canonical representation of verification point L1 (FIG. 4a) will be similar to that of L2 (FIG. 4b), and the canonical representation of verification point R1 will be similar to that of R2.

Referring again to FIG. 5, computing the canonical representation of the Boolean expressions of verification point P at 128 may ensure that all the verification points with similar functionality (but possibly dissimilar Boolean expressions) have similar canonical representation of respective Boolean expressions. That is, renaming of the variables and/or canonization of the Boolean expressions (i.e., converting the Boolean expressions into corresponding canonical or BDD forms) may ensure that even if two isomorphic verification points are structurally different but functionally similar, their canonical forms are similar. Note that if two functions are structurally similar (e.g., the two circuit segments of FIGS. 4a and 4b), merely renaming the variables of the two functions in an appropriate manner may help identify the isomorphism between the two points.

Each Boolean expression graph may be represented by a unique string signature. As previously discussed in more details, appropriate renaming of variables may sometimes ensure that two different functions that are structurally the same (but depend on different variables) may yield similar Boolean expressions. However, there may be situations (e.g., when the renaming is not appropriate and/or when the functions are structurally different) where two Boolean expressions that are structurally different (namely, two different Boolean expression graphs) but functionally similar may have different string signatures. The functional similarity between these Boolean expressions may then be identified by converting these Boolean expressions into corresponding canonical forms (e.g., BDDs). Canonical representation of a Boolean expression graph may also be represented by a unique string signature, and string signatures of canonical representations corresponding to isomorphic verification points (e.g., BDDs that represent isomorphic verification points) may always be similar.

In various embodiments, at 132, a string signature may be generated for each canonical representation of a verification point. At 136, for each verification point P, a signature of the verification point may be generated, by optionally concatenating the sub-signatures of P, states of P, and assumptions of P. As previously discussed, functionally similar (i.e., isomorphic) Boolean expression may have similar canonical representation (computed, for example, using BDD), and hence, string signatures of canonical representations of isomorphic verification points may also be similar. In various embodiments, the signature of each verification point may be computed by concatenating the signatures of the expressions of all slices that compose it, and the associated assumptions. For example, referring to FIGS. 4a and 4b, two string signatures may be generated for both outputs R1 and R2, one signature for the expression (L1 ∧ V1) and one for the expression ((C1 ∧ (V2 ∨ V3)) ∨ (¬C1 ∧ L1)). Since the canonical representations of R1 and R2 are the same, their signature may also be the same.

Referring again to FIG. 5, at 140, verification points with same signature (i.e., isomorphic verification points) may be identified and grouped together. The grouping of isomorphic verification points may reduce the number of points that may be needed to be verified during a verification process, as has been previously discussed in more details with respect to methods 40 and 60 of FIGS. 2 and 3, respectively.

Figure 6:
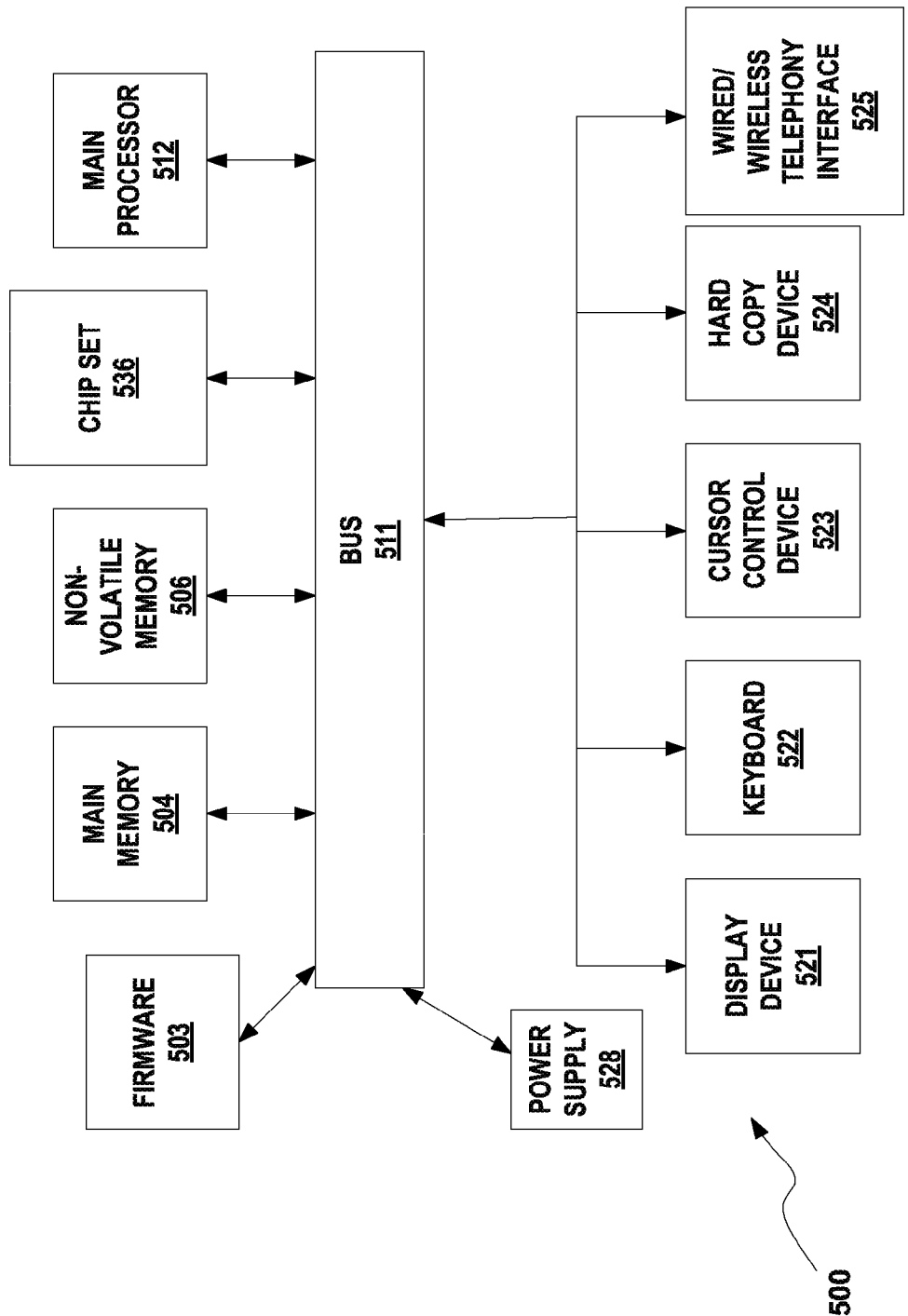
FIG. 6 illustrates a block diagram of an example computing system that may be suitable for practicing some of the embodiments, including grouping of isomorphic verification points to reduce the number of points that need to be verified.

FIG. 6 illustrates a block diagram of an example computing system 500 that may be suitable for practicing some of the embodiments, including optimization of verification of integrated circuit chip design. In some embodiments, the computing system 500 may include a communication mechanism or bus 511 for communicating information, and an integrated circuit component such as a processor 512 coupled with bus 511 for processing information.

Computing system 500 further comprises a random access memory (RAM) or other dynamic storage device 504 (referred to as main memory) coupled to bus 511 for storing information and instructions to be executed by processor 512. Main memory 504 also may be used for storing temporary variables or other intermediate information during execution of instructions by processor 512.

Firmware 503 may be a combination of software and hardware, such as Electronically Programmable Read-Only Memory (EPROM) that has the operations for the routine recorded on the EPROM. The firmware 503 may embed foundation code, basic input/output system code (BIOS), or other similar code. The firmware 503 may make it possible for the computing system 500 to boot itself.

Computing system 500 also comprises a read-only memory (ROM) and/or other static storage device 506 coupled to bus 511 for storing static information and instructions for processor 512. The static storage device 506 may store OS level and application level software.

Computing system 500 may further be coupled to a display device 521, such as a cathode ray tube (CRT) or liquid crystal display (LCD), coupled to bus 511 for displaying information to a computer user. A chipset, such as chipset 536, may interface with the display device 521.

An alphanumeric input device (keyboard) 522, including alphanumeric and other keys, may also be coupled to bus 511 for communicating information and command selections to processor 512. An additional user input device is cursor control device 523, such as a mouse, trackball, trackpad, stylus, or cursor direction keys, coupled to bus 511 for communicating direction information and command selections to processor 512, and for controlling cursor movement on a display device 521. A chipset, such as chip set 536, may interface with the input output devices.

Another device that may be coupled to bus 511 is a hard copy device 524, which may be used for printing instructions, data, or other information on a medium such as paper, film, or similar types of media. Furthermore, a sound recording and playback device, such as a speaker and/or microphone (not shown) may optionally be coupled to bus 511 for audio interfacing with computing system 500. Another device that may be coupled to bus 511 is a wired/wireless communication capability 525.

Computing system 500 has a power supply 528 such as a battery, AC power plug connection and rectifier, etc., as one of ordinary skill in the relevant art will appreciate based at least on the teachings provided herein.

In various embodiments, the two models to be compared during a FEV process (or a single model to be verified during a FPV process) may be stored in the main memory 504 or non-volatile memory 506. Alternatively, in various embodiments, the models may be stored in an external storage accessible by the computing system 500. In various embodiments, the processor 512 may execute instructions that may result in determining isomorphic verification points, as is described, for example, in method 120 of FIG. 5. In various embodiments, the processor 512 may also execute instructions that may result in grouping isomorphic verification points and/or conducting the verification process on representative points, as is described, for example, in methods 40 and 60 in FIGS. 2 and 3, respectively.

In various embodiments, processor 512 may execute instructions that may result in grouping of the verification points at 64 and/or selection of representative verification points at 68 of FIG. 3, whereas verification of the representative verification point at 72 and/or extending the results at 76 of FIG. 3 may be carried out by a different processor (located either in the computing system 500 or in a different computing system). In various embodiments, processor 512 may execute instructions to perform the verification process on the selected verification points and/or extend the verification results to the isomorphic counterpart verification points.

Although certain example methods, apparatus, and articles of manufacture have been described herein, the scope of coverage of this disclosure is not limited thereto. On the contrary, this disclosure covers all methods, apparatus, and articles of manufacture fairly falling within the scope of the appended claims either literally or under the doctrine of equivalents. For example, although the above discloses example systems including, among other components, software or firmware executed on hardware, it should be noted that such systems are merely illustrative and should not be considered as limiting. In particular, it is contemplated that any or all of the disclosed hardware, software, and/or firmware components could be embodied exclusively in hardware, exclusively in software, exclusively in firmware or in some combination of hardware, software, and/or firmware.

What is claimed is:

1. A method comprising:
   selecting a first verification point and a second verification point of a model of an integrated circuit design;
   determining, by using a processor, whether the first and second verification points are isomorphic;
   verifying only a selected one of the first and second verification points in case the first and the second verification points are isomorphic;
   determining a result of verifying the selected one of the first and second verification points;
   extending the determined result of the selected one of the first and second verification points to one of the first and second verification points that was not selected for verification;
   wherein said determining whether the first and second verification points are isomorphic comprises: analyzing a first Boolean expression and a second Boolean expression for the first and the second verification points, respectively; and converting the first Boolean expression and the second Boolean expression into corresponding canonical representations of the first and the second Boolean expressions, respectively;
   wherein said determining whether the first and second verification points are isomorphic further comprises: generating a first signature and a second signature for the first and the second verification points, respectively, based at least in part on the canonical representations of the first and the second Boolean expressions, respectively, wherein the first and second signatures are unique to the canonical representations of the first and the second Boolean expressions, respectively;
   comparing the first signature with the second signature; and
   determining whether the first and second verification points are isomorphic based at least in part on said comparing.

2. The method of claim 1, wherein said verifying the selected one of the first and second verification points further comprises:
   verifying the selected one of the first and second verification points using a formal equivalence verification (FEV) process or a formal property verification (FPV) process.

3. The method of claim 1, wherein said determining whether the first and the second verification points are isomorphic further comprises:
   determining that the first and the second verification points are isomorphic if the first and the second signatures are substantially similar.

4. An article comprising:
   a non-transitory computer-readable storage medium; and
   instructions stored in the storage medium, and configured to program a processor to enable the processor to:

generate a first Boolean expression and a second Boolean expression for a first verification point and a second verification point, respectively, wherein the first and second verification points are included in a model of an integrated circuit design;

convert the first and the second Boolean expressions into a corresponding first and second canonical representation, respectively;

generate a first signature and a second signature for the first and the second verification points, respectively, based at least in part on the first and second canonical representations, respectively; wherein the first and second signatures are unique to the canonical representations of the first and the second Boolean expressions, respectively;

compare the first signature with the second signature;

determine whether the first verification point and the second verification point are isomorphic based at least in part on the comparison;

verify a selected one of the first and second verification points if the first verification point and the second verification point are isomorphic;

determine a result of verifying the selected one of the first and second verification points; and extend the determined verification result of the selected one of the first and second verification points to one of the first and second verification points that was not selected for verification.

5. The article of claim 4, wherein the processor is enabled to:

compute a third Boolean expression of a state of the first verification point, and a fourth Boolean expression of an assumption of the first verification point;

convert the third and the fourth Boolean expressions into a corresponding third and fourth canonical representation, respectively;

generate the first signature based at least in part on the third and fourth canonical representations.

6. The article of claim 4, wherein the processor is enabled to:

determine that the first verification point and the second verification point are isomorphic if the first signature is substantially similar to the second signature.

7. The article of claim 4, wherein the processor is enabled to:

convert said first and second Boolean expressions into said corresponding first and second canonical representation utilizing binary decision diagrams (BDD).

* * * * *